United States Patent
Yu et al.

(10) Patent No.: US 9,252,102 B2
(45) Date of Patent: Feb. 2, 2016

(54) SEMICONDUCTOR STRUCTURE AND METHOD FOR MANUFACTURING THE SAME

(71) Applicant: Macronix International Co., Ltd., Hsinchu (TW)

(72) Inventors: Bing-Lung Yu, Hsinchu (TW); Chin-Tsan Yeh, Hsinchu (TW); Yung-Tai Hung, Chiayi (TW); Chin-Ta Su, Yunlin County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/297,679

(22) Filed: Jun. 6, 2014

(65) Prior Publication Data

US 2015/0357286 A1    Dec. 10, 2015

(51) Int. Cl.
*H01L 23/52* (2006.01)
*H01L 23/532* (2006.01)
*H01L 23/522* (2006.01)
*H01L 21/768* (2006.01)

(52) U.S. Cl.
CPC .... *H01L 23/53238* (2013.01); *H01L 21/76843* (2013.01); *H01L 23/5226* (2013.01); *H01L 23/53223* (2013.01); *H01L 23/53266* (2013.01)

(58) Field of Classification Search
CPC .................................. H01L 23/53238
USPC ........................................... 257/211
See application file for complete search history.

(56) References Cited

U.S. PATENT DOCUMENTS

| | | |
|---|---|---|
| 5,552,341 A | 9/1996 | Lee |
| 6,936,535 B2 | 8/2005 | Kim et al. |
| 7,732,331 B2 | 6/2010 | Kim et al. |
| 7,955,979 B2 * | 6/2011 | Kostamo et al. ............. 438/685 |
| 7,956,465 B2 * | 6/2011 | Huang ......................... 257/751 |
| 2005/0106857 A1 | 5/2005 | Min |
| 2008/0174021 A1 | 7/2008 | Choi et al. |

* cited by examiner

*Primary Examiner* — Anthony Ho
(74) *Attorney, Agent, or Firm* — McClure, Qualey & Rodack, LLP

(57) ABSTRACT

A semiconductor structure and a method for manufacturing the same are provided. The semiconductor structure comprises a conductive layer, a via, and a barrier layer disposed between the conductive layer and the via. The barrier layer is stuffed with oxygen.

12 Claims, 5 Drawing Sheets

SEMICONDUCTOR STRUCTURE AND METHOD FOR MANUFACTURING THE SAME

BACKGROUND

1. Technical Field

The disclosure relates to a semiconductor structure and a method for manufacturing the same. More particularly, the disclosure relates to a semiconductor structure comprising an oxygen-stuffed barrier layer and a method for manufacturing the same.

2. Description of the Related Art

In a semiconductor structure, above electronic devices such as memories or transistors, interconnection layers are generally formed to provide electrical connections. The interconnection layers are connected to one another by vias. Typically, in order to prevent diffusions of the component materials or reactive/deposition gases using in the processes, barrier layers are provided between the interconnection layers and the vias.

SUMMARY

In this disclosure, a semiconductor structure comprising a more effective barrier layer and a method for manufacturing the same are provided.

According to some embodiment, the semiconductor structure comprises a conductive layer, a via, and a barrier layer disposed between the conductive layer and the via. The barrier layer is stuffed with oxygen.

According to some embodiment, the method for manufacturing the semiconductor structure comprises following steps. First, a barrier layer is formed on a conductive layer. Then, the barrier layer is stuffed with oxygen. After that, a via is formed on the barrier layer stuffed with the oxygen.

Figure 1:
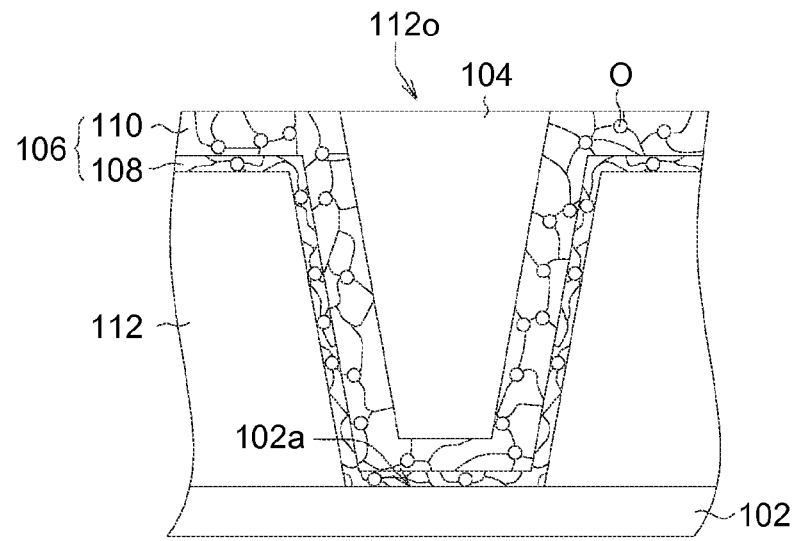
FIG. 1 shows a semiconductor structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIG. 1, a semiconductor structure 100 according to one embodiment is shown. The semiconductor structure 100 comprises a conductive layer 102, a via 104, and a barrier layer 106 disposed between the conductive layer 102 and the via 104. The barrier layer 106 is stuffed with oxygen O. More specifically, the oxygen O is stuffed into grain boundaries of the barrier layer 106. This and the other figures are provided only for explanation, and relative sizes, amounts, bonding conditions, and the like shown therein may not be illustrated as the real conditions.

The conductive layer 102 may be an interconnection layer comprising interconnection lines, such as Cu, Al or AlCu lines. In other words, the conductive layer 102 may comprise Cu, Al or AlCu. The via 104 may comprise W or Cu. The barrier layer 106 may be a single-layer structure, a bi-layer structure or a multi-layer structure comprising Ta, Ti, TaN, TiN or WN. In this embodiment, the barrier layer 106 consists of a first barrier layer 108 and a second barrier layer 110. The first barrier layer 108 is disposed on the conductive layer 102. The second barrier layer 110 is disposed on the first barrier layer 108 and under the via 104. For example, the first barrier layer 108 may comprise Ti, and the second barrier layer 110 may comprise TiN.

More specifically, the conductive layer 102 may be fabricated from Cu, and the via 104 may be fabricated from W. At this time, the barrier layer 106 may comprise a TiN layer (i.e. the second barrier layer 110) of which grain boundaries are stuffed with the oxygen O. The barrier layer 106 may further comprise a Ti layer (i.e. the first barrier layer 108) disposed between the conductive layer 102 and the TiN layer. In some cases, grain boundaries of the Ti layer may also be stuffed with the oxygen O.

While not intended to be limited, the semiconductor structure 100 generally further comprises an inter-layer dielectric 112 disposed on the conductive layer 102. The inter-layer dielectric 112 has an opening 1120 exposing a portion 102a of the conductive layer 102. The barrier layer 106 contacts the exposed portion 102a of the conductive layer 102. The via 104 is disposed in the opening 1120.

Here, since the oxygen O is stuffed into the grain boundaries of the barrier layer 106, a diffusion path to the underlying conductive layer 102 is blocked. Further, the effect of boundary defects may be counteracted by the stuffed oxygen O. As such, during the formation of the via 104, $WF_6$ gas, which is commonly used for W via deposition, cannot pass through these grain boundaries to the underlying conductive layer 102. Thus, compared to a conventional semiconductor structure of which the barrier layer is not stuffed with oxygen, the underlying conductive layer 102 in this embodiment is less likely to be corroded by the $WF_6$ gas, thereby a resistance degradation caused by the corrosion can be avoided. This is particularly true when the conductive layer 102 is fabricated from Cu.

Figure 2:
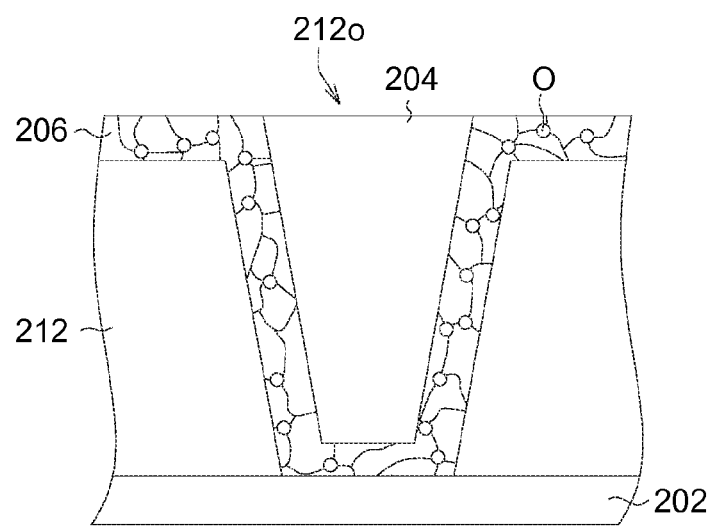
FIG. 2 shows a semiconductor structure according to another embodiment.

Referring to FIG. 2, a semiconductor structure 200 according to another embodiment is shown. The semiconductor structure 200 differs from the semiconductor structure 100 in that the barrier layer 206 consists of a single layer. This single layer may comprise TiN. The configuration, arrangement, materials ant the like of the other elements, such as the conductive layer 202, the via 204 and the inter-layer dielectric 212, are similar to those of the corresponding elements of the semiconductor structure 100. The related description is thus omitted herein.

Similar to the semiconductor structure 100, the semiconductor structure 200 has the benefit of avoiding corrosion of the conductive layer 202 caused by the $WF_6$ gas used to form the W vias. Compared to the semiconductor structure 100, the semiconductor structure 200 is more beneficial since the Ti barrier layer is removed from this structure. While not intended to be limited by the theory, the Ti barrier layer is thought to be another source of the corrosion of the conductive layer 202. Due to the Ti layer lacks a strong bonding strength like in the TiN layer, Ti in the Ti layer may diffuse to the conductive layer 202. In cases that the conductive layer 202 is fabricated from Cu, the diffused Ti may react with Cu and form Cu—Ti compound, thereby lead to Cu voids. The Cu voids may gather and cause a resistance degradation of the Cu conductive layer 202. Rather than blocking Ti from diffusion by an additional oxygen stuffing as in the semiconductor structure 100, the removing of the Ti layer from the structure as in this embodiment is a more elementary way.

Figure 3:
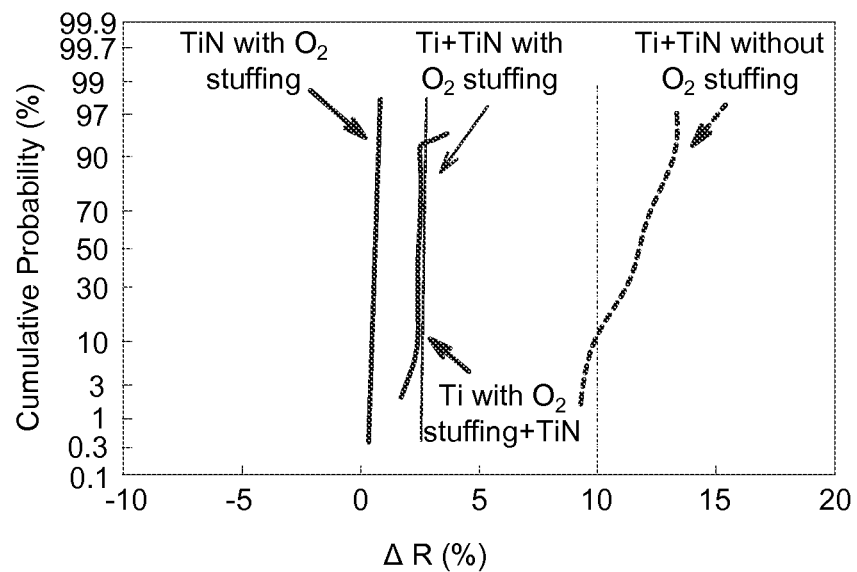
FIG. 3 shows the graph related to a semiconductor structure according to one embodiment described herein.

Stress migration test is used to test the change of resistance. Referring to FIG. 3, the difference between the resistance after baking at 250° C. for 1000 hr and the original resistance is designated as ΔR. For application, the value of ΔR should equal to or less than 10%. FIG. 3 shows that the result of the semiconductor structure comprising the barrier layer including TiN or Ti layer stuffed with oxygen is good. Almost no resistance change after baking at 250° C. for 1000 hr. Further, no void or missing of Cu is observed after baking at 250° C. for 1000 hr (the images are not shown herein).

Now referring to FIGS. 4A-4E, a method for manufacturing a semiconductor structure according to one embodiment is schematically shown.

Figure 4A:
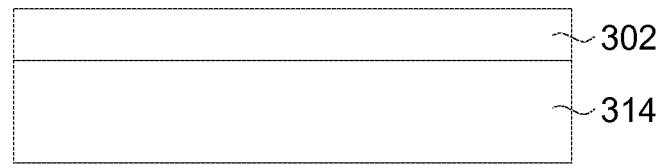
FIGS. 4A-4E schematically show a method for manufacturing a semiconductor structure according to one embodiment.

At first, as shown in FIG. 4A, a conductive layer 302 formed over an underlying structure 314 is provided. The underlying structure 314 may comprise a substrate and electronic devices (for example, memories or transistors) formed thereon. The conductive layer 302 may comprise interconnection lines, such as Cu, Al or AlCu lines. In particular, the conductive layer 302 may be fabricated from Cu.

Figure 4B:
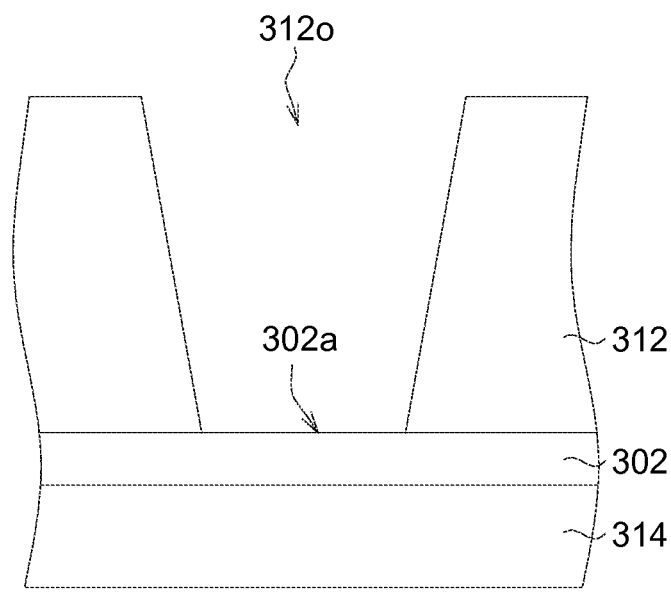

An inter-layer dielectric 312 is optionally formed on the conductive layer 302, as shown in FIG. 4B. The inter-layer dielectric 312 has an opening 312o exposing a portion 302a of the conductive layer 302.

Figure 4C:
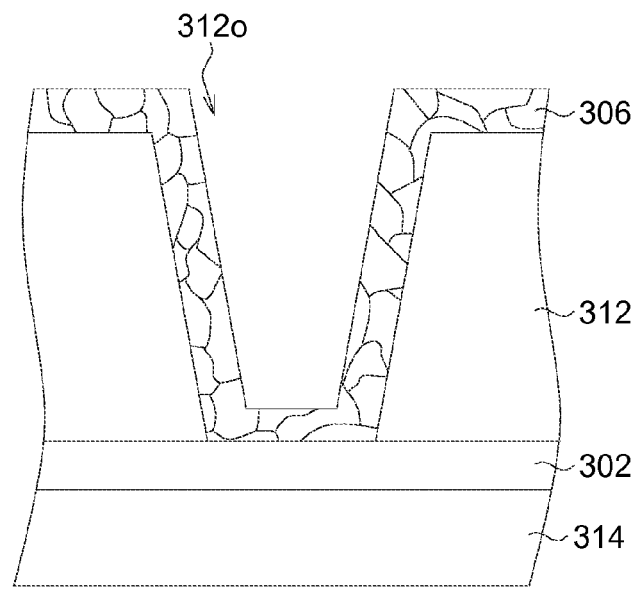
Figure 4C:
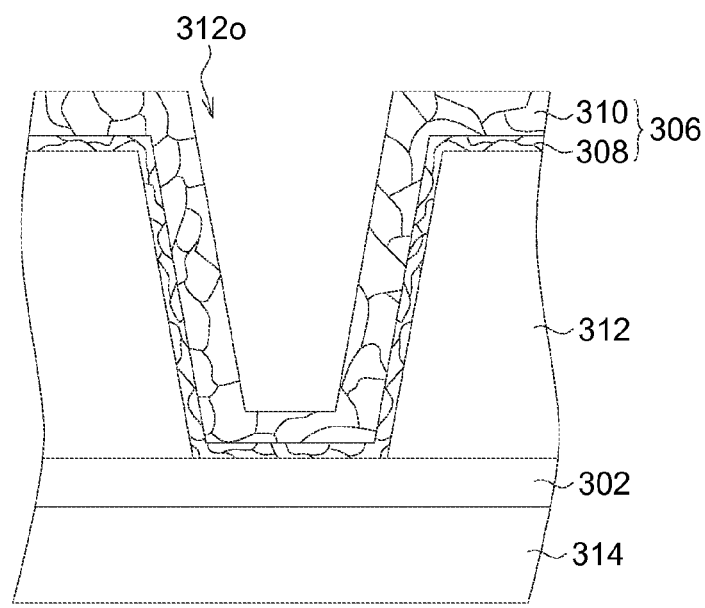

As shown in FIG. 4C, a barrier layer 306 is formed on the conductive layer 302 and the inter-layer dielectric 312 (if the inter-layer dielectric 312 is formed). The barrier layer 306 directly contacts the exposed portion 302a of the conductive layer 302. In this case, the barrier layer 306 consists of a single layer. The barrier layer 306 may comprise Ta, Ti, TaN, TiN or WN. In particular, the barrier layer 306 may be fabricated from TiN by such as metal organic chemical vapor deposition (MOCVD).

Alternatively, as shown in FIG. 4C', the barrier layer 306 may comprise more than one layer. In this case, the barrier layer 306 consists of a first barrier layer 308 and a second barrier layer 310. The step of forming the barrier layer 306 comprises forming the first barrier layer 308 on the conductive layer 302 and forming the second barrier layer 310 on the first barrier layer 308. The first barrier layer 308 may be fabricated from Ti by such as physical vapor deposition (PVD), and the second barrier layer 310 may be fabricated from TiN by such as MOCVD.

Figure 4D:
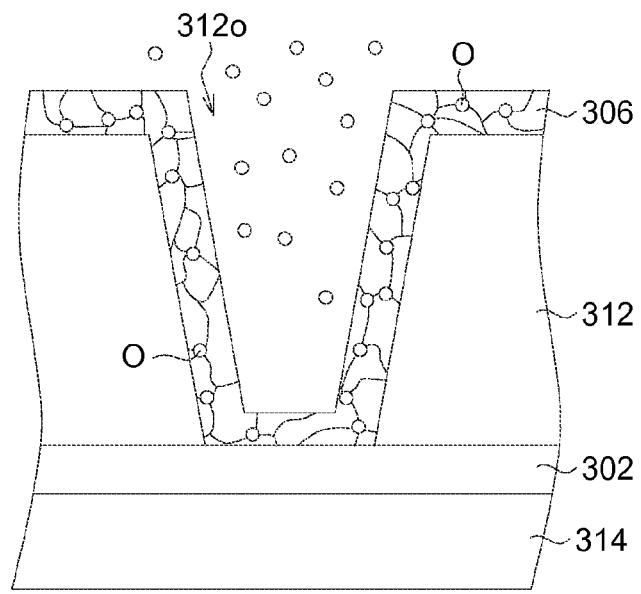

The barrier layer 306 is stuffed with oxygen molecular ($O_2$), indicated by O, as shown in FIG. 4D. This may be achieved by providing oxygen gas. More specifically, a pressure may be controlled at from 6 torr to 10 torr, and oxygen gas may be provided at a rate from 25 sccm to 85 sccm for 10 seconds to 60 seconds.

Figure 4E:
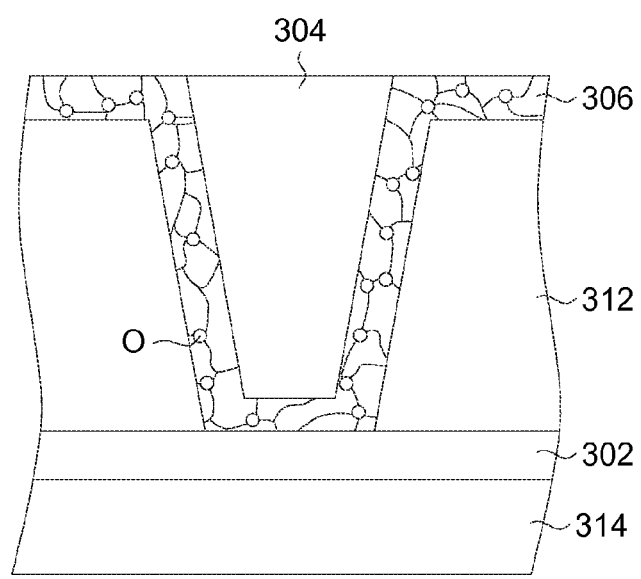

As shown in FIG. 4E, a via 304 is formed on the barrier layer 306 stuffed with the oxygen O. In the cases that the inter-layer dielectric 312 is formed, the via 304 is disposed in the opening 312o. The via 304 may comprise W or Cu. In particular, the via 304 may be fabricated by $WF_6$ chemical vapor deposition (CVD). Since the oxygen O is stuffed into the grain boundaries of the barrier layer 306, the $WF_6$ gas will not pass through the grain boundaries to the underlying conductive layer 102 and lead to a corrosion and even a resistance degradation of the conductive layer 302.

In summary, by stuffing the grain boundaries of the barrier layer by oxygen, the diffusion path for a component material or a reactive/deposition gas is blocked and the effect of boundary defects may be counteracted, thereby a more effective barrier layer can be obtained. In addition, the semiconductor structure may not comprise a Ti barrier layer. At this time, the Cu voids caused by the diffusion of Ti atom in the Ti barrier layer can be completely avoided.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a conductive layer;
   a via; and
   a barrier layer disposed between the conductive layer and the via, wherein the barrier layer is stuffed with oxygen, and the oxygen is stuffed into grain boundaries of the barrier layer.

2. The semiconductor structure according to claim 1, wherein the conductive layer comprises interconnection lines.

3. The semiconductor structure according to claim 1, wherein the conductive layer comprises Cu, Al or AlCu.

4. The semiconductor structure according to claim 1, wherein the via comprises W or Cu.

5. The semiconductor structure according to claim 1, wherein the barrier layer comprises Ta, Ti, TaN, TiN or WN.

6. The semiconductor structure according to claim 1, wherein the barrier layer consists of a single layer.

7. The semiconductor structure according to claim 6, wherein the single layer comprises TiN.

8. The semiconductor structure according to claim 1, wherein the barrier layer consists of:
   a first barrier layer disposed on the conductive layer; and
   a second barrier layer disposed on the first barrier layer and under the via.

9. The semiconductor structure according to claim 8, wherein the first barrier layer comprises Ti, and the second barrier layer comprises TiN.

10. The semiconductor structure according to claim 1, further comprising:
    an inter-layer dielectric disposed on the conductive layer, the inter-layer dielectric having an opening exposing a portion of the conductive layer,
    wherein the barrier layer contact the exposed portion of the conductive layer, and the via is disposed in the opening.

11. The semiconductor structure according to claim 1, wherein the conductive layer is fabricated from Cu, the via is fabricated from W, and the barrier layer comprises a TiN layer of which grain boundaries are stuffed with the oxygen.

12. The semiconductor structure according to claim 11, wherein the barrier layer further comprises a Ti layer disposed between the conductive layer and the TiN layer.

* * * * *